United States Patent [19]

Mueller

[11] Patent Number: 4,825,086

[45] Date of Patent: Apr. 25, 1989

[54] APPARATUS FOR THE EXACT MUTUAL ALIGNMENT OF A MASK AND SEMICONDUCTOR WAFER IN A LITHOGRAPHIC APPARATUS

[75] Inventor: Karl-Heinz Mueller, Berlin, Fed. Rep. of Germany

[73] Assignee: Siemens Aktiengesellschaft, Berlin and Munich, Fed. Rep. of Germany

[21] Appl. No.: 73,760

[22] Filed: Jul. 15, 1987

[30] Foreign Application Priority Data

Jul. 15, 1986 [DE] Fed. Rep. of Germany ....... 3623891

[51] Int. Cl.⁴ .......................................... G01N 23/00
[52] U.S. Cl. ............................. 250/491.1; 250/492.2; 250/442.1; 250/548; 378/34; 356/400
[58] Field of Search ............... 250/491.1, 492.2, 442.1, 250/548; 378/34; 356/399, 401

[56] References Cited

U.S. PATENT DOCUMENTS

| | | | |
|---|---|---|---|
| 4,238,780 | 12/1980 | Doemens | 340/146.3 |
| 4,253,112 | 2/1981 | Doemens | 358/101 |
| 4,472,824 | 9/1984 | Buckley | 250/491.1 |
| 4,525,852 | 6/1985 | Rosenberg | 250/491.1 |
| 4,746,800 | 5/1988 | Van Eijk et al. | 250/442.1 |

OTHER PUBLICATIONS

Folchi et al, "X-Ray Lithography Mask Alignment Stage", *IBM Technical Disclosure Bulletin,* vol. 25, No. 12, May 1983, pp. 6400–6401.

Müller et al, "Overlay Measurements for X-Ray Lithography", *J. Vac. Sci. Technol.,* B 3(1), Jan./Feb. 1985, pp. 241–244.

*Primary Examiner*—Carolyn E. Fields
*Assistant Examiner*—John A. Miller
*Attorney, Agent, or Firm*—Hill, Van Santen, Steadman & Simpson

[57] ABSTRACT

An arrangement and method for the exact, mutual alignment of a mask and a semiconductor wafer in a lithographic apparatus so that the mask and wafer are in a plane extending perpendicular to the particle beam. The apparatus includes a seating arrangement for the mask having a first retaining part and arrangement for positioning this first retaining part relative to a table which allows adjusting the plane of the first retaining part. The apparatus also includes a second retaining part for securing the wafer thereto, which second retaining part is mounted on the plate by an arrangement that allows adjusting the plane of the second retaining part relative to the axis so that the surface of the semiconductor wafer can also be placed in a plane extending perpendicular to the beam direction.

10 Claims, 5 Drawing Sheets

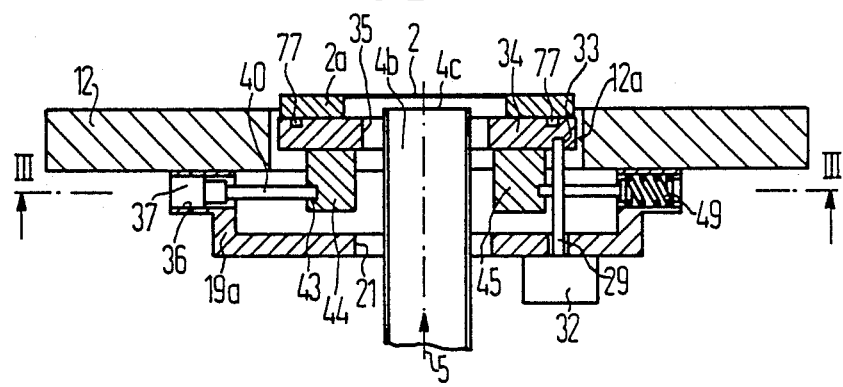
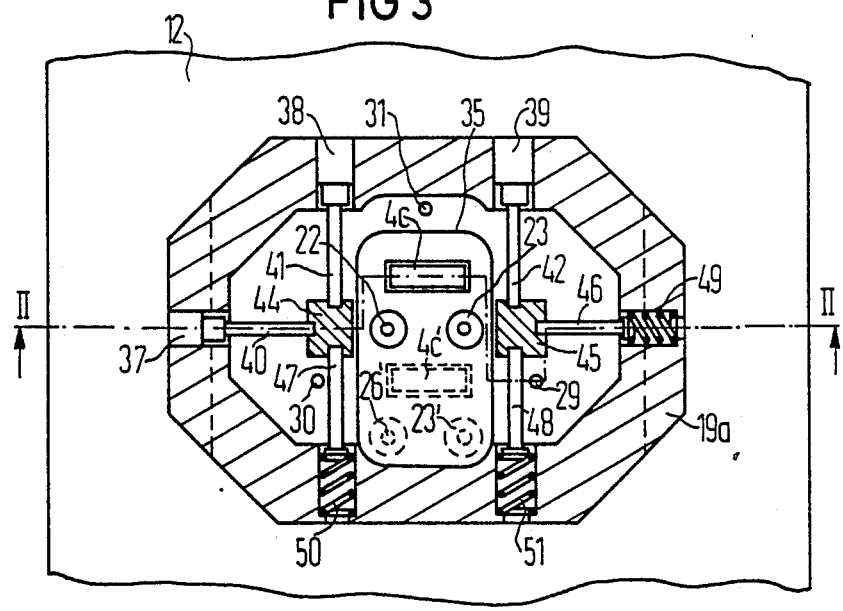

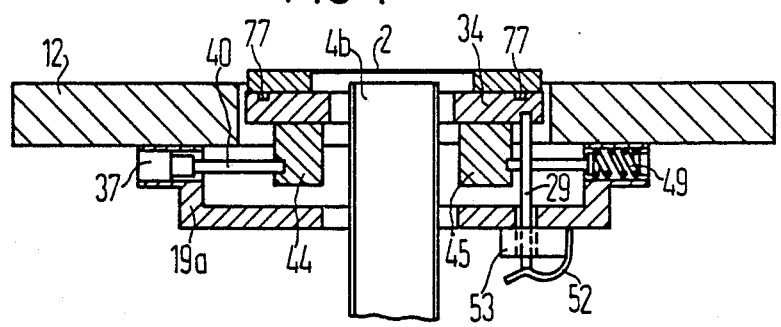
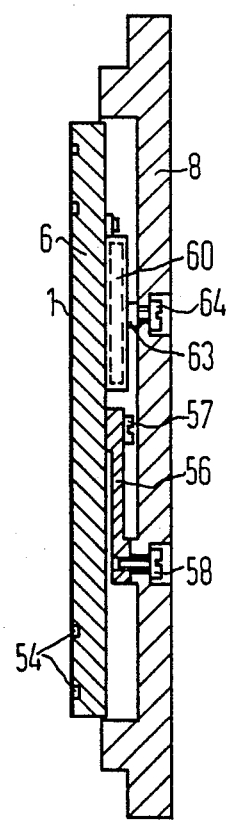

APPARATUS FOR THE EXACT MUTUAL ALIGNMENT OF A MASK AND SEMICONDUCTOR WAFER IN A LITHOGRAPHIC APPARATUS

BACKGROUND OF THE INVENTION

The present invention is directed to a method and an arrangement for the exact, mutual alignment of a mask and a semiconductor wafer in a lithographic apparatus. The apparatus includes an arrangement for conducting a parallel particle beam to impinge first on a structured mask and then at the semiconductor wafer which is to be structured, and the apparatus includes a mask positioning arrangement including a first retaining plate having a device for securing the mask thereon, a first group of setting pins extending perpendicular to the plane of the mask and parallel to the direction of propagation of the particle beam for mounting the first retaining plate on a table. A second group of three setting pins, which are arranged parallel to the plane of the mask in a plane extending perpendicular to the direction of propagation of the particle beam for shifting the first retaining plate parallel in a plane along a first coordinate axis, a second coordinate axis and/or rotating the first retaining plate in the plane.

An arrangement having a first retaining plate, which is mounted on pins extending parallel to the direction of the beam path and which is movable in a plane perpendicular to the beam path by a second group of pins is disclosed in an article by G. A. Folchi et al "X-RAY LITHOGRAPHIC MASK ALIGNMENT STAGE" *IBM TECHNICAL DISCLOSURE BULLETIN*, Vol. 25, No. 12, May 1983, pp. 6400-6401. A lithographic apparatus wherein such arrangement can be utilized is disclosed, for example, in an article by K. H. Mueller "OVERLAY MEASUREMENTS FOR X-RAY LITHOGRAPHY" *J. Vac. Sci. Technol. B*, Vol. 3, No. 1, Jan/Feb 1985, pp. 241-244.

Adjustment marks are usually provided on the mask and on the semiconductor wafer. These adjustment marks are interpreted by optical means and are used for the creation of setting signals which control the adjustment mechanisms which carry out the mutual alignment. For faultless adjustment, the distance between the mask and the semiconductor wafer must be selected so large that the mask and wafer do not touch one another during alignment movements, since such a touching would potentially lead to damage to the surfaces and to a misalignment because of frictional forces that would occur. For the manufacture of LSI semiconductor structures, particularly those having a resolution of 0.1 um or below, on the other hand, the distance should be adequately small, even given exposure of the semiconductor wafer with an X-radiation comprising great parallelism in order to make defraction effects at the structure edge practically impossible. However, both demands can only be largely met when the mask and the semiconductor wafer are arranged as plane-parallel as possible relative to one another in the adjustment position.

SUMMARY OF THE INVENTION

The object of the present invention is to provide an arrangement for an exact, mutual alignment of a mask and semiconductor wafer in a lithographic apparatus which guarantees both a faultless, mutual fine adjustment of the mask and semiconductor wafer, as well as an optimally high resolution of the generated semiconductor structures.

These objects are obtained in an improvement in an arrangement for exact, mutual alignment of a mask and a semiconductor wafer in a lithographic apparatus utilizing a parallel particle beam which impinges the structure of the mask and the semiconductor waveguide to be structured one after another, said arrangement including first mounting means for positioning the mask in the beam including a first retaining plate with first means for securing a mask thereto, said first mounting means including a first group of setting pins being arranged to extend perpendicular to the plane of the mask and parallel to the particle beam to position the first retaining plate in a frame-like mounting part secured to a table of the arrangement, a second group of three setting pins being arranged to extend parallel to the plane of the mask for initiating alignment with one of the three pins initiating alignment of the first retaining plate parallel to the first coordinate axis and the other two pins initiating alignment movements parallel to a second coordinate axis and also rotational movement. The improvements comprising the first group of setting pins being displacably mounted on a mounting part of the table and having controllable drive mechanisms for changing the length of each of the first group of setting pins.

The advantage obtainable with the invention is particularly that the slight distance between the mask and the semiconductor wafer which is desired for reasons of making structures finer can be set with significantly greater precision as a result of the plane-parallelism between these parts which can be achieved in a better manner than in the previously known arrangements. The reduction which is thereby possible in the distance can be set in controlled fashion and leads to an improvement in the resolution of the structure given otherwise identical conditions.

It is desirable that the drive mechanisms for the first group of pins are composed of pre-stressed springs acting on the pins and a controllable clamp element which releasably grips the pins and will hold them in a selected axial position.

The semiconductor wafer can be secured to a second retaining plate with two fastening elements and the second retaining plate is then connected to an insertion plate via flexible connecting elements and is movable relative to the insertion plate by a controllable drive mechanism having a third group of setting pins movable in a direction perpendicular to the plane of the semiconductor wafer and parallel to the particle beam direction so that the mutual position of the second retaining plate can be set relative to the insertion plate. The insertion plate is then inserted in a recess of a stage or table which is connected by a holding mechanism to the table or plate, which holding mechanism is fashioned so that a rough alignment of the semiconductor wafer relative to the particle beam can occur on the basis of a translation or rotational movement of the stage relative to the table plate.

This arrangement can also be used for positioning the mask in a plane extending perpendicular to the path of the beam. The table is arranged to be moved perpendicular to the direction of the particle beam and will carry the retaining means and, thus, will move both the mask and the semiconductor wafer in both a scanning motion and also a step-type motion.

The invention is also directed to a method of utilizing the apparatus to position the mask. One method positions the mask on the first retaining means, while another method utilizes the second retaining means used for positioning the semiconductor wafer to position the mask and then brings the first retaining means for the mask into contact with the mask and then transfers the mask thereto.

Other advantages and objects of the present invention will be readily apparent from the following description of the preferred embodiments, the drawings and claims.

BRIEF DESCRIPTION OF THE DRAWINGS

FIG. 2 is a cross sectional view taken along the lines II—II of FIG. 3 of a detailed embodiment of the apparatus of FIG. 1;

FIG. 3 is a cross sectional view taken along the lines III—III of FIG. 2;

FIG. 4 is a cross sectional view similar to FIG. 2 showing a preferred embodiment of the mask mount in accordance with the present invention;

FIG. 5 is a cross sectional view of a semiconductor wafer mount taken along the lines V—V of FIG. 6;

DESCRIPTION OF THE PREFERRED EMBODIMENTS

Figure 1:
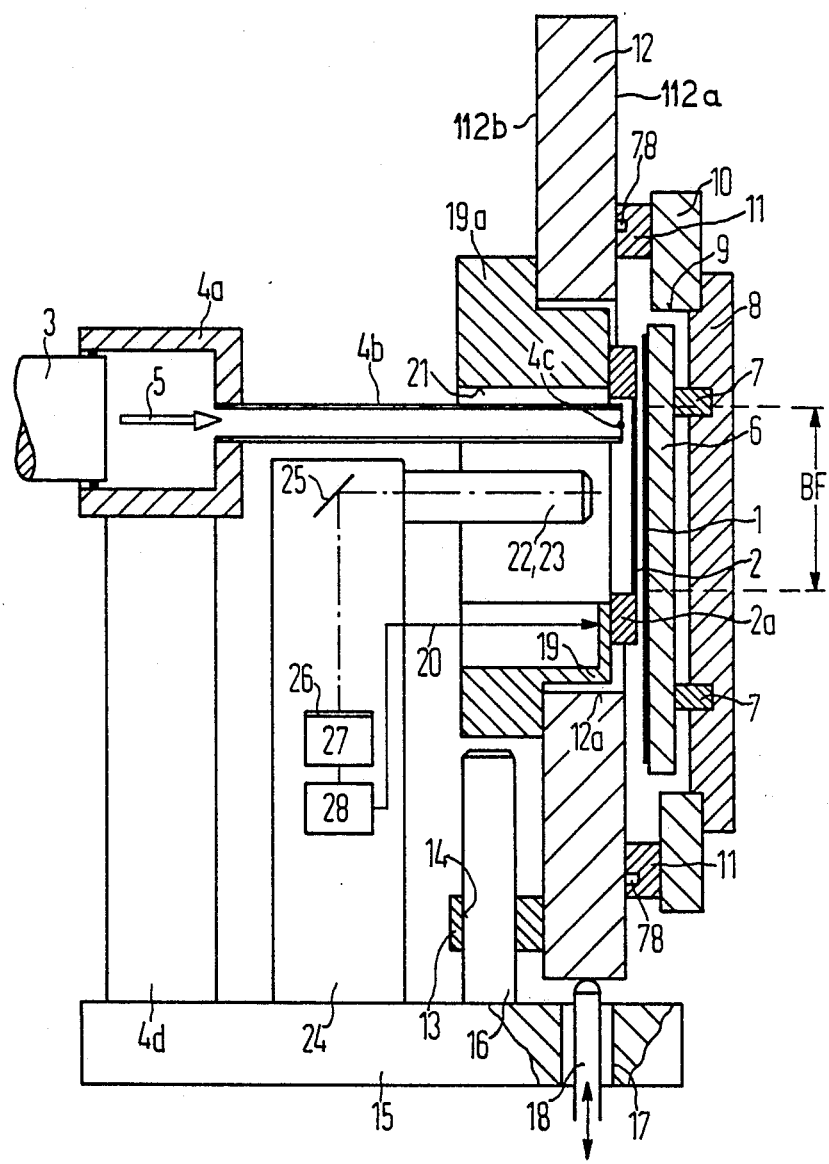
FIG. 1 is a schematic longitudinal cross sectional illustration of a lithographic apparatus for exposing semiconductor wafers with X-radiation having great parallelism in accordance with the present invention.

The principles of the present invention are particularly useful when incorporated in a lithographic apparatus for exposure of a semiconductor wafer 1 which is to be structured by utilizing a structured mask tube mounted at a prescribed distance therefrom and the structuring is carried out with a synchroton radiation supplied via a tube 3, as illustrated in FIG. 1. The X-radiation has a high parallelism and is expediently coupled out of a storage ring of an electron accelerator. The tube 3 is followed by a beam feeder, generally indicated at 4, which is composed of a cylindrical part 4a secured to the tube 3. The part 4a has a projecting flange or tube 4b which has a rectangular cross section which terminates in a radiation window 4c. The cylindrical part 4a is attached to a base 4d, which is mounted on a base 15 of the apparatus. The X-radiation guided in the tube 3 through the tube or projection 4b is indicated by an arrow 5 to show the beam direction. The clear width of the parts 4b and 4c measured perpendicular to the plane of the drawing is greater than the clear height measured in a vertical direction so that the cross section of the tube 4b and window 4c is adapted to the cross section of the X-ray beam supplied via the tube 3 and will have a rectangular cross section, such as indicated by the window 4c in FIG. 3. The clear width can, for example, mount to 40 mm and the clear height can amount to about 8 mm.

A semiconductor wafer 1 is secured to a retaining plate 6 which in turn is connected to an insertion plate 8 by connecting elements 7. The insertion plate 8 is introduced into an opening or aperture 9 of a table or stage 10 and is rigidly connected thereto. The stage 10 is in turn provided with spacer elements 11 which hold it at a prescribed distance from a back surface 112a of a table or plate 12. The table 12 is situated in a plane perpendicular to the beam direction 5 and is displacable in a vertical direction to this plane. To this end, a projection 13 of the table 12 is provided with a bore 14 which displacably slides on a pin 16 secured to the base plate 15. A pin 18, which projects through an opening 17 in the base plate 15 will engage the table 12 and is movable, as indicated by the double arrows, in a longintudinal direction of the pin to displace the table in a vertical direction and, thus, displace the semiconductor wafer connected to it via the parts 6-11 perpendicular to the beam direction 5.

A mask 2, which has a reinforced edge zone 2a forming a frame, is seated on a frame-like mounting part 19. The mounting part 19 is secured to a front side or surface 112b of the table 12, as seen in the beam direction, with a flange-like projection 19a and is fashioned so that for the purpose of fine adjustment, the mask 2 is displacable in two coordinate directions relative to the semiconductor wafer 1 in a plane lying perpendicular to the beam direction 5 and can also be rotated in this plane. For reason of simple illustration, the parts 19 and 19a are not shown in detail in FIG. 1. However, it could be of the same nature and structure as known, for example, as disclosed in the above-mentioned article from *IBM Tech. Disc. Bull.* It is adequate for an understanding of FIG. 1 to imagine the mask 2 is movable in the described way relative to the mount part 19 and 19a, which are secured to the table 12. This movement is effected by adjustment mechanism, which is not shown in FIG. 1, but which is discussed in greater detail and which is selectively driven via lines, for example, line 20. The frame-like mounting part 19 and 19a projects into an opening or recess 12a of the table 12. The mask 2, which covers an opening 21 of the part 19, is also situated within the opening 12a or, respectively, is positioned in an offset relative thereto in the beam direction 5. An offset opposite the beam direction 5, however, could also be possible.

Reading adjustment marks are present on the semiconductor wafer 1 and also on the mask 2. These marks are observed with the assistance of at least two optical devices 22 and 23, which are positioned side-by-side (FIG. 3). What can be understood is that the optical devices 22 and 23 are two objectives of microscopes, which are preferably arranged on a column 24 and which transmit images of the adjustment marks via a mirror 25 onto a picture screen 26 of a video pick-up means 27. The video pick-up means 27 creates electrical signals from these images and they are supplied to an electronic data processor 28. In the processor 28, the received signals are processed into adjustments signals, which are supplied via the line 20 to the adjustment mechanisms provided in the part 19.

A fine adjustment of the position of the mask 2 relative to the semiconductor wafer, which is assumed to be in a stationary position, occurs with the assistance of the adjustment signals so that the exact position, which matches the two parts, is achieved.

As seen in the beam direction, the radiation window 4c is located immediately proceeding the mask 2 and is stationarily arranged inside the opening 21 or, respectively, corresponding to FIG. 1 inside the edge zone or frame 2a of the mask 2. The distance between the window 4c and the mask 2 can, for example, amount to 1 mm. The optical devices 22 and 23, which are provided next to the radiation feeding tube 4b and which have their optical axes aligned parallel to the beam direction 5 likewise lie in the inside of the opening 21. When the part of the mask or, respectively, the semiconductor wafer lying opposite the radiation window 4c is referred to as an impinging surface, then the optical devices 22 and 23 are aligned at such parts of the mask which lie in a relative position of the parts 1, 2 and 4 outside of the impinging surface, as shown in FIG. 1.

Figure 7:
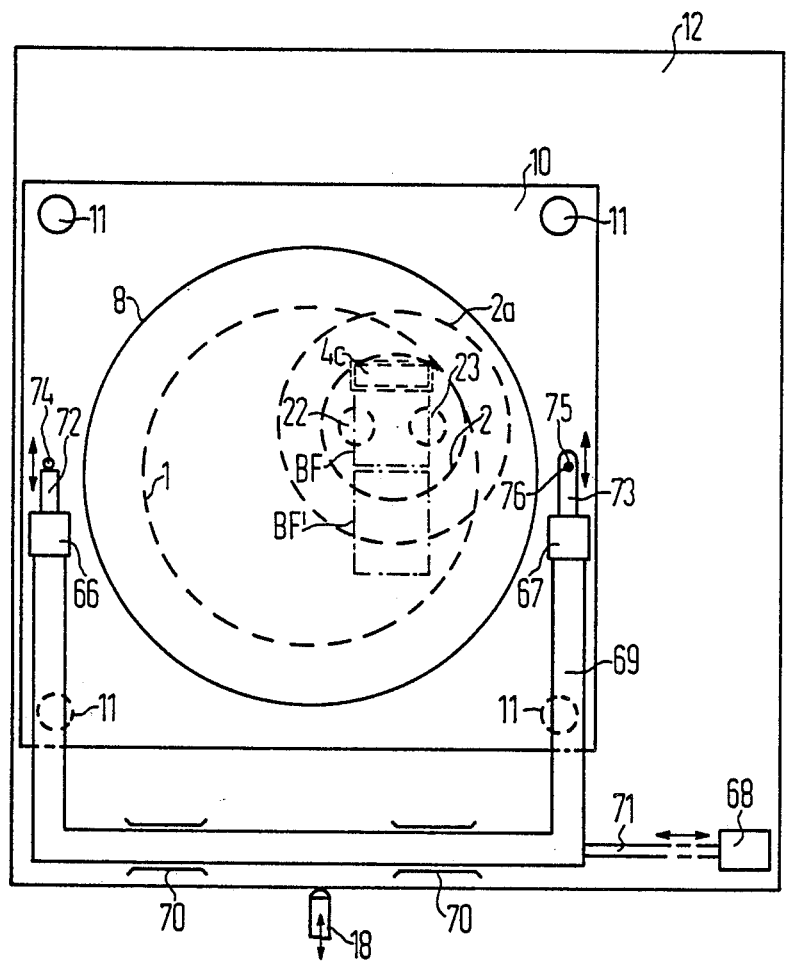
FIG. 7 is a schematic end view of the semiconductor wafer mount.

For exposing the semiconductor wafer 1, one then proceeds so that a defined exposure field BF is first brought into such a position relative to the table plate 12 and relative to the mask 2 held thereon that the exposure field BF lies opposite the mask. This occurs in the fashion set forth in greater detail hereinbelow and as illustrated in FIG. 7. The adjustment marks of the semiconductor wafer 1 and of the mask 2 are, thus, situated so close next to one another that their images can be picked up by the optical devices 22 and 23 and can be transmitted onto the picture screen 26. The adjustment signals are derived in the equipment or processor 28 and will influence the adjustment mechanism of the mount 19 so that a precise, mutual adjustment of the parts 1 and 2 will be achieved. In the adjusted position, the table 12 and the semiconductor wafer 1 with the mask 2 are moved perpendicularaly up on the basis of an upwardly directed movement of the pin 18 so that given a feed of the parallel X-radiation 5, the impinging surface is gradually shifted from top to bottom over the entire exposure field BF. This movement of the parts 1 and 2 past the radiation window 4c can also be referred to as a "scan" motion. After the exposure of the field BF, the semiconductor wafer 1 can then be preferably adjusted relative to the table 12 and, thus, relative to the mask 2 so that the mask lies opposite a new exposure field BF' (FIG. 7). This adjustment can be interpreted as a "step" motion.

In accordance with the invention, the frame-like mount part 19, schematically illustrated in FIG. 1 is constructed so that the mask 2 and its frame 2a can be aligned perpendicular to the beam direction 5 and can also be finely adjusted with great precision relative to the semiconductor wafer to be structured with a fine adjustment in the mask plane defined in this way. A preferred embodiment of this mount part is shown in FIGS. 2 and 3. This mounting means includes a first group of three setting pins 29, 30 and 31 (FIG. 3), which are arranged to extend perpendicular to the plane of the mask 2 and are longitudinally displacable in the mounting part 19a, which is secured to the table 12 and the pins are respectively coupled to controllable drive mechanisms which are secured on the part 19a. As illustrated in FIG. 2, the drive mechanism for the pin 29 is provided and is indicated by a block 32. The setting pins 29-31 are flexibly fashioned and have their ends inserted into bores 33, which are provided in a retaining plate 34 on which the frame 2a of the mask 2 is secured. The setting pins 29-31 thus define the position of the mask and have their length being adjustable on the basis of the drive mechanism, such as the mechanism 32. The retaining plate 34 is situated inside a recess or opening 12a of the table 12 and the plate 34 in turn has an opening 35 into which the end of the tube or projection 4b of the beam feed extends.

Three drive mechanisms or actuators 37-39 (FIG. 3) are provided in additional bores such as 36 (FIG. 2) of the retaining part 19a. These drive mechanisms 37-39 actuate flexible setting pins 40-42, which are movable in a longtudinal direction and are arranged parallel to the plane of the mask 2 and have their ends inserted into bores, for example, 43 of two projections 44 and 45 of the plate 34. By actuating the setting pin 40, the retaining plate 34 can be shifted or carried on the flexible setting pins 29-31 to initiate a parallel movement in the plane along a first coordinate axis, such as an x-axis. When actuators 38 and 39 move the pins 41 and 42, the alignment motion will be parallel to a second coordinate axis, such as a y axis and/or can also involve a rotational movement in the plane. The rotaional movement occurs given the oppositely directed motion of the setting pins 41 and 42. The alignment motion parallel to the second coordinate axis occurs given an identical direct motion of the two pins 41 and 42. The setting pins 40-42 and the retaining plate 34 are held in a defined position by cooperating pins 46, 47 and 48, which engage the projections 44 and 45 opposite to the engagement by the pins for 40, 41 and 42. The pins 46, 47 and 48 are urged against the projections 44 and 45 by compression springs 49, 50 and 51, respectively.

The mask 2 is aligned perpendicular to the beam direction 5 by means of the corresponding adjustment of the setting pins 29-31 of the first group. An actuation of the setting pins 40-42 of the second group then effects a fine adjustment of the mask 2 with reference to the semiconductor wafer 1 within the mask plane set in this fashion. FIG. 3 also identifies the position of the optical devices 22 and 23 relative to the radiation window 4c.

In FIG. 4, a preferred embodiment of the mask mount of FIGS. 2 and 3 is illustrated. In particularly the drive mechanism 33 is shown in the preferred embodiment of a pre-stressed leaf spring 52. In addition of the drive mechanism includes a clamp mechanism 53, which is secured to the mount part 19a and in the clamped position firmly grips the setting pin, for example 29 in its clamped jaws to hold it fixedly relative to the part 19a. When the jaws are released, which preferably occurs on the basis of piezo-electric setting elements, the setting pins 29 can be moved out of the influence of the leaf spring 52 so that the mask 2 will approach the semiconductor wafer 1, which is positioned opposite thereto. The piezo-electricated clamp jaws, which stopped this movement in their clamped position, are controlled by the setting signal supplied from the electronic data processor 28.

Figure 6:
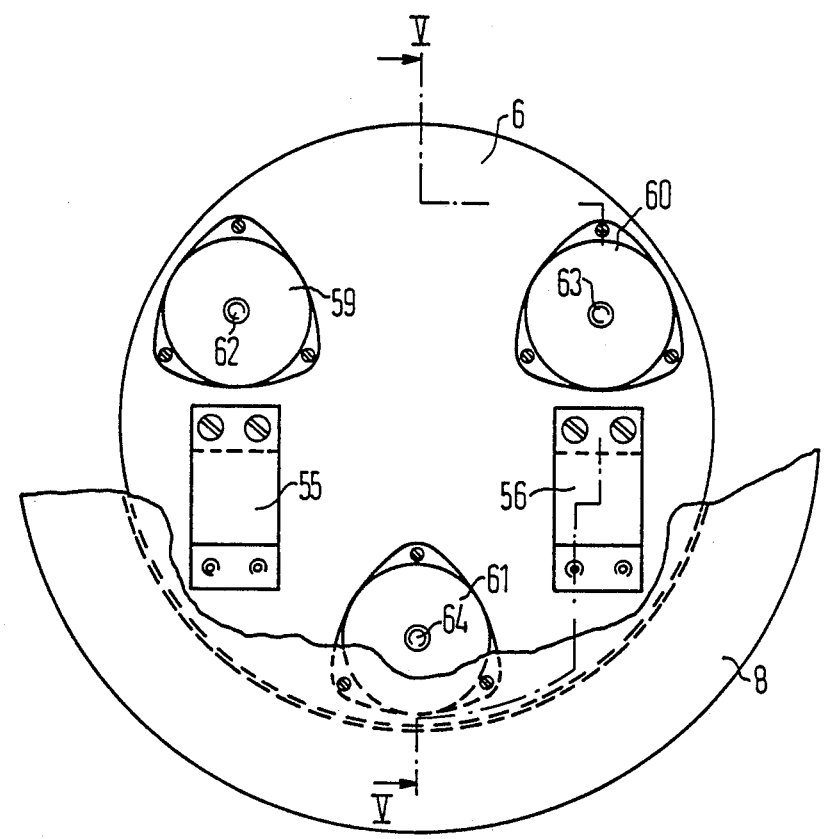
FIG. 6 is a partial end view, with portions broken away for purposes of illustration, of the semiconductor wafer mount.

A preferred embodiment of the parts 6, 7 and 8, which serve for forming first means for positioning or mounting the semiconductor wafer 1 and which are schematically illustrated in FIG. 1, are illustrated in greater detail in FIGS. 5 and 6. The semiconductor wafer 1 is secured to a retaining plate 6 with a vacuum-controlled suction means which has grooves 54. Instead of the suction means, however, other fastening elements can be utilized. The retaining plate 6 is connected to an insertion plate 8 via flexible connecting elements 55 and 56 (FIG. 6). As best illustrated in FIG. 5, the connecting element 56 has an elongated, flexible web whose ends are respectively secured to the retaining plate 6 by screw-type connectors or fasteners 57 and to the insertion plate 8 by screw-type connectors or fasteners 58. In addition, three drive mechanisms 59, 60 and 61 (FIG. 6) are provided and are attached to the retaining plate 6 and are coupled with setting pins 62-64 against which set screws are supported. The setting pins 62-64 are movable perpendicular to the plane of the semiconductor wafer 1 and define the position of the retaining plate 6 with respect to the insertion plate 8. On the basis of an appropriate drive of the drive mechanisms or actuators 59-61, the surface of the semiconductor wafer 1 can be aligned to lie in a plane perpendicular to the beam direction 5.

FIG. 7 shows an overall mount of the semiconductor wafer 1 in a plane extending perpendicular to the beam 5. The table or stage 10, into whose opening the insertion plate 8 with the semiconductor wafer 1 secured and movable thereon, is movable relative to the table 12 because of drive mechanisms 66, 67 and 68. Advantageously, the stage 10 is secured to the table 12 by a U-shaped connecting link 69, which is mounted for sliding movement in a horizontal displacable fashion in guides or bearings 70, which are attached to the plate 12. The drive of the connecting link 69 in this direction occurs by a setting pin 71, which extends from the actuating mechanism 68 that is mounted on the plate 12. The actuators 66 and 67 are mounted on the free ends of the U-shaped member 69 and have pins 72 and 73, respectively. The pin 72 engages a pin 74 of the stage 10, while the pin 73 has a bore 76 receiving a pin 75 secured to the stage 10. The setting pins 71, 72 and 73 are each movable in both directions as indicated by the double arrow. The "step" motion is generated by the mechanism 66-68 and the semiconductor wafer 1 is thus adjusted relative to the mask 2 on the basis of this "step" motion to present additional or different exposure fields BF or BF'. In FIG. 7, the two optical devices 22 and 23 are also illustrated relative to the window 4c and these optical devices are used for the fine adjustment of the mask relative to the semiconductor wafer.

For the alignment of the mask 2 perpendicular to the beam direction 5, one proceeds such that the mask is secured to the retaining plate 34 in the initial position shown in FIG. 3. This securement can be by a vacuum-controlled suction device which has grooves 77 in FIGS. 2 and 4. The optical devices 22 and 23 are then aligned to the adjustment marks which are situated in a first region of the mask 2. Setting signals are then obtained from the adjustment marks via the optical devices 22 and 23 and these setting signals are supplied to the drive mechanism, for example 32, for the setting pins 29-31 and cause these to adjust the mask into the focal plane of the optical devices 22 and 23. The optical devices and their determination of the focal plane are known per se and examples of their use are shown in U.S. Pat. Nos. 4,238,780 and 4,253,112, whose disclosures are incorporated herewith. A "scan" motion of the table 12 subsequently occurs in common with the mask 2 held thereon by moving the actuating pin 18. The mask 2 thus proceeds to a new position relative to the window 4c and the optical devices 22 and 23 and this new position is indicated by the element 4c', 22' and 23' in FIG. 3. In this new position, the optical devices 22 and 23 are aligned to a second region of the mask in which additional adjustment marks are supplied. Further or additional setting signals will be created via the optical devices 22 and 23 and the elements 27 and 28 and these additional setting signals together with the previous setting signals initially obtained are used to position the mask and enable precise alignment of the mask into the focal plane of the elements 22 and 23. The alignment of the mask 2 perpendicular to the main direction 5 is thus accomplished.

An individual alignment of the semiconductor wafer 1 perpendicular to the beam direction 5 can be omitted in those instances in which the wedge error of the semiconductor wafer 1, for example the angular error of the plane-parallelism between the front surface and the back surface of the wafer 1 is adequately small. In those instances, the alignment of the semiconductor wafer is established by the relative position of the parts 10, 8 and 6 relative to the table 12.

However, when the wedge error of the semiconductor wafer is so high that it can no longer be neglected, then, upon employment of the semiconductor wafer mount of FIGS. 5 and 6, one proceeds in the following fashion. After the semiconductor wafer 1 is secured to the retaining plate 6 with the fastening element 54, the insertion plate 8 is inserted into the stage 10. The mask 2 is thereby already usually situated on the mask mount 19a. With respect to the optical devices 22 and 23, the semiconductor wafer 1 assumes an initial position, which is indicated in FIG. 7. Through transparent locations of the mask, adjustment marks applied to the semiconductor wafer 1 are picked up by the optical devices 22 and 23 and are again processed to form setting signals which initiate the drive mechanisms 59-61 to adjust the semiconductor wafer into the focal plane of the devices 22 and 23. A "scan" motion of the table 12, in common with the semiconductor wafer 1 held thereon, subsequently occurs by actuating the drive for the pin 18. The semiconductor wafer thereby proceeds to a new position relative to the devices 22 and 23. In this new position, the optical device of 22 and 23 are aligned to a second region of the semiconductor wafer 1 in which a second group of adjustment marks are applied. Further setting signals are now obtained via the devices 22 and 23 and the control means 27 and 28, and these further or additional setting signals, together with the previous signals which were obtained at the initial position enable exact alignment of the surface of the wafer into the focal plane for the devices 22 and 23. The semiconductor wafer 1 is thus aligned exactly perpendicular to the beam direction 5.

Given a mask mount fashioned in accordance with FIG. 4 and given a semiconductor wafer mount fashioned in accordance with FIGS. 5 and 6, the exact alignment of the mask can also occur in such a fashion that the setting signals derived from the adjustment marks are applied only for the control of the drive mechanisms 59-61. The control of the clamp mechanism 53, depended on the adjustment marks, is thereby eliminated. Such alignment procedure sequence is as follows: first, the mask 2 is immediately secured to the retaining plate 6 by means of the fastening element 54. After the insertion of the plate 8 into the stage 10, the mask is situated in the initial position indicated in FIG. 3 relative to the parts 4c and the devices 22 and 23. The adjustment marks applied to the mask 2 were processed into setting signals via the elements 22, 23, 27 and 28, and these setting signals cause the drive mechanisms 59-61 to position the mark into the focal plane of the devices 22 and 23. A "scan" motion of the table 12 subsequently occurs in common with the mask 2 held thereon by actuating the movement of the pin 18. The mask 2, thus, proceeds into a new position relative to the devices 22 and 23 and this new position is indicated in FIG. 3 by the reference characters such as 4c', 22' and 23'. In this position, the optial devices 22 and 23 are aligned to a new region of the mask 2, which has a new set of adjustment marks. The optical devices 22 and 23, as well as the electronic units 27 and 28, create new setting signals and, together with the previously formed setting signals, which were obtained in the initialed position of the mask 2 enable an exact alignment of the mask onto the focussing plane for the optical devices 22 and 23.

After the mask has been aligned perpendicular to the beam direction 5 in this manner, the clamping mechanisms 53 are actuated to release the adjustment pins 29-31. Under the action of the leaf springs 52, the retaining plate 34 thereby moves in the direction towards the aligned mask 2 which is secured to the retaining plate 6 and ultimately contacts the mask 2. Following thereupon, the clamp mechanisms 53 are again brought into the clamping position and the fastening element 77 is actuated so that the mask 2 is secured to the retaining plate 34. When this occurs, the fastening element 54 is released to release the connection between the mask 2 and the plate 6. The adjustment mask 2 is thus transferred from the retaining plate 6 to the retaining plate 34. Subsequently, a semiconductor wafer is secured to the retaining plate 6 and, when warranted, is brought into a defined position perpendicular to the beam direction 5 by means of the individual alignment procedure set forth hereinabove.

Expediently, the drive mechanisms 32, 37-39 and 59-61 are composed of known piezo electric adjustment elements. The spacer elements 11 secured to the stage 10 can, preferably, be provided with vacuum-controlled suction devices, such as indicated by grooves 78 in FIG. 1. As a result of the build-up of a vacuum in the grooves 78, the table 12 and the stage 10 are clamped to one another. This occurs following the rough adjustment of the mask 2 and the semiconductor wafer 1 by means of the drive mechanism 66-68 and before the fine adjustment by means of the drive mechanisms 32, 37-39 and under given conditions the actuators 59-61. The firm connection of the parts 10 and 12 is also preserved during the exposure of the semiconductor wafer. The vacuum-controlled suction device indicated by the grooves 54 and 77 are operated in the same way in order to fasten the mask to or, respectively, the semiconductor wafer to the retaining plate 34 or, respectively, the retaining plate 6.

Although various minor modifications may be suggested by those versed in the art, it should be understood that we wish to embody within the scope of the patent granted hereon all such modifications as reasonably and properly come within the scope of our contribution to the art.

I claim:

1. In an arrangement for exact, mutual alignment of a mask and a semiconductor wafer in a lithographic apparatus which utilizes parallel particle beams impinging on a structured mask and then into the semiconductor wafer to be structured, said apparatus including means for positioning the mask in the beam path including a first retaining plate having first means for securing, a first group of setting pins extending perpendicular from the plate and parallel to the beam path and being secured to a table, a second group of three setting pins being mounted for displacement in a first controllable drive mechanism secured on a mounting part which is secured on said table, said second group being arranged to extend parallel to the plane of the mask and being actuated to move the first retaining plate parallel to a first coordinate axis, parallel to a second coordinate axis and to also rotate the plate in the plane, the improvements comprising the first group of setting pins being mounted for displacement in a second controllable drive mechanism secured on said mounting part.

2. In an arrangement according to claim 1, wherein the second controllable drive mechanism for said first group of pins includes a pre-stressed spring for each pin of said first group and a controllable clamp element gripping each pin of said first group to rigidly connect each pin of the first group to the mounting part in any selected longitudinally displaced position.

3. In an arrangement according to claim 1, which includes means for mounting a semiconductor wafer including a second retaining plate having second means for securing the wafer to the second retaining plate, said second retaining plate being connected to an insertion plate by flexible connecting elements, a third group of three setting pins having third controllable drive mechanism being positioned between the second retaining plate and the insertion plate for changing the planar position of the second retaining plate relative to the insertion plate, said insertion plate being insertable in an opening in a stage, said stage being secured to the table by a holding mechanism constructed to provide a rough alignment of the semiconductor wafer relative to the particle beams to insure the basis of the translation and the rotary movement of the stage.

4. In an arrangement according to claim 3, wherein the second means for securing temporarily secures the mask to the second retaining plate.

5. In an arrangement according to claim 3, wherein the table is mounted for movement in a perpendicular direction to the particle beams, said table being movable in common with the mounting part and, under given conditions, in common with the holding mechanism, two optical devices being oriented in a direction of the particle beams and laterally offset from one another relative to the moving direction of the table, said mask being provided with adjustment marks interpreted by the two optical devices, said two optical devices creating signals to control the actuation of first, second and third controllable drive mechanisms of different groups of pins.

6. In an arrangement according to claim 3, wherein the second means for securing are vacuum-controlled suction devices.

7. In an arrangement according to claim 3, wherein the controllable drive mechanisms for the first group of pins and the third group of pins are composed of piezo electric setting devices.

8. A method for aligning a mask perpendicular to a direction of a particle beam in an apparatus having means for mounting the mask including a first retaining plate having a fastening means for securing the mask thereto, said first retaining plate being mounted on a table being movable at least between a first and second position, said method including securing the mask with the fastening means on the first retaining plate, observing adjustment marks with optical devices to obtain setting signals for the first position of the table, utilizing the setting signals to adjust the position of the first retaining plate and mask relative to the table to be in the focus plane of the optical devices, then shifting the table in a perpendicular direction to the direction of the particle beam to a second position, observing a second adjustment mark at the second position to obtain additional setting signals which serve for the adjustment of the mask into the focal plane of the optical devices.

9. A method for the alignment of a semiconductor wafer perpendicular to a direction of particle beams of an apparatus having means for mounting a semiconductor wafer including a retaining plate having means for fastening an object thereon, and two spaced optical means for controlling the movement of the retaining plate relative to a table, said two spaced optical means having focussing planes, the method having steps including securing a semiconductor wafer on the retaining plate by said means for fastening, observing first adjustment marks of the semiconductor wafer with the two optical means to create setting signals for changing the position of the retaining plate to position the wafer in the focus plane of the two optical devices, then shifting the table perpendicular to the direction of the particle beams to a second position, observing adjustment marks on the semiconductor wafer at said second position to obtain additional setting signals, utilizing the additional setting signals to make further adjustments in the position of the plane of the surface of the semiconductor wafer into the focus plane of said two optical means.

10. A method for the alignment of a mask perpendicular to the direction of particle beams in an apparatus having first means including a first retaining plate for securing the mask, second means for securing a wafer on a second retaining plate positioned on a table, said method comprising the steps of securing the mask on a second retaining plate of the second means, observing first adjustment marks on the mask with optical devices to obtain setting signals for positioning the mask in the focal plane of said optical devices, moving the mask and second means to position the mask in the focal plane, then shifting the table in a perpendicular direction to present a second position, observing a second group of adjustment marks to create setting signals for the adjustment of the mask into the focal plane, positioning the mask in said focal plane utilizing the second set of signals, then contacting the mask with the first retaining plate of said first means, securing the mask to the first retaining plate while releasing the mask from the second retaining plate and then securing the first retaining plate in the fixed position.

* * * * *